(12) United States Patent
Liao et al.

(10) Patent No.: US 11,296,001 B2
(45) Date of Patent: Apr. 5, 2022

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Guo-Cheng Liao, Kaohsiung (TW); Yi Chuan Ding, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 16/592,543

(22) Filed: Oct. 3, 2019

(65) Prior Publication Data
US 2020/0126881 A1 Apr. 23, 2020

Related U.S. Application Data

(60) Provisional application No. 62/748,172, filed on Oct. 19, 2018.

(51) Int. Cl.
*H01L 23/31* (2006.01)
*H01L 25/065* (2006.01)
*H01L 23/498* (2006.01)
*H01L 23/544* (2006.01)

(52) U.S. Cl.
CPC .... *H01L 23/3121* (2013.01); *H01L 23/49822* (2013.01); *H01L 23/544* (2013.01); *H01L 25/0657* (2013.01); *H01L 2223/54426* (2013.01)

(58) Field of Classification Search
CPC ............... H01L 23/3121; H01L 23/544; H01L 23/49822; H01L 25/0657; H01L 2223/54426
See application file for complete search history.

(56) References Cited

U.S. PATENT DOCUMENTS

| | | | | |
|---|---|---|---|---|
| 5,250,983 A * | 10/1993 | Yamamura | .......... | G03F 7/70425 355/125 |
| 5,266,380 A * | 11/1993 | Renguso | .............. | H05K 3/4638 174/250 |
| 6,091,026 A * | 7/2000 | Yang | .................... | H05K 3/4638 174/250 |
| 6,232,559 B1 * | 5/2001 | Janecek | ............... | H05K 3/4638 174/250 |
| 6,820,525 B2 * | 11/2004 | Johnson | ................ | H01L 23/544 257/797 |
| 6,841,890 B2 * | 1/2005 | Fujimoto | .............. | G03F 9/7076 257/797 |
| 8,994,022 B2 * | 3/2015 | Tailliet | .................... | H01L 22/34 257/48 |
| 2008/0023854 A1 * | 1/2008 | Marinet | ................ | H01L 23/544 257/797 |

(Continued)

*Primary Examiner* — Tuan A Hoang
(74) *Attorney, Agent, or Firm* — Foley & Lardner LLP

(57) ABSTRACT

A package substrate includes a first dielectric layer, a first patterned conductive layer and a first set of alignment marks. The first patterned conductive layer is disposed on the first dielectric layer. The first set of alignment marks is disposed on the first dielectric layer and adjacent to a first edge of the first dielectric layer. The first set of alignment marks includes a plurality of alignment marks. Distances between the alignment marks of the first set of alignment marks and the first edge are different from each other.

20 Claims, 13 Drawing Sheets

(56) References Cited

U.S. PATENT DOCUMENTS

2010/0117080 A1\* 5/2010 Chen .................. H01L 24/05
 257/48
2019/0043834 A1\* 2/2019 Kim .................. H01L 23/315

\* cited by examiner

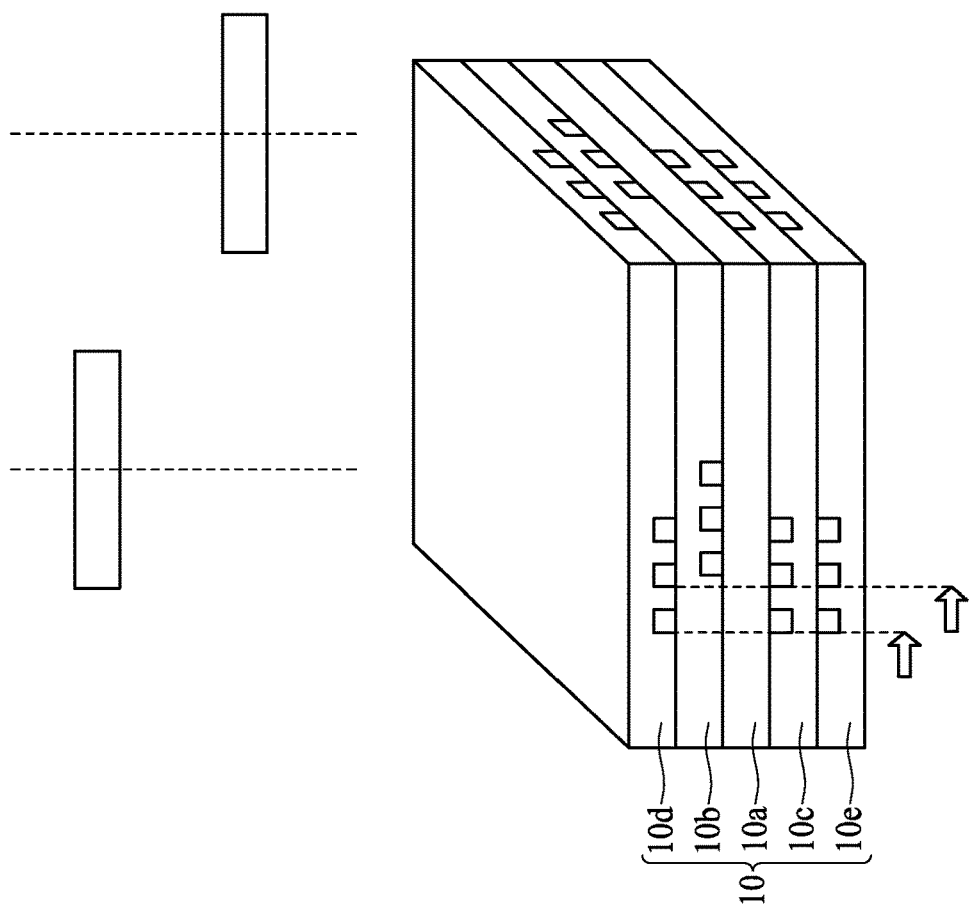
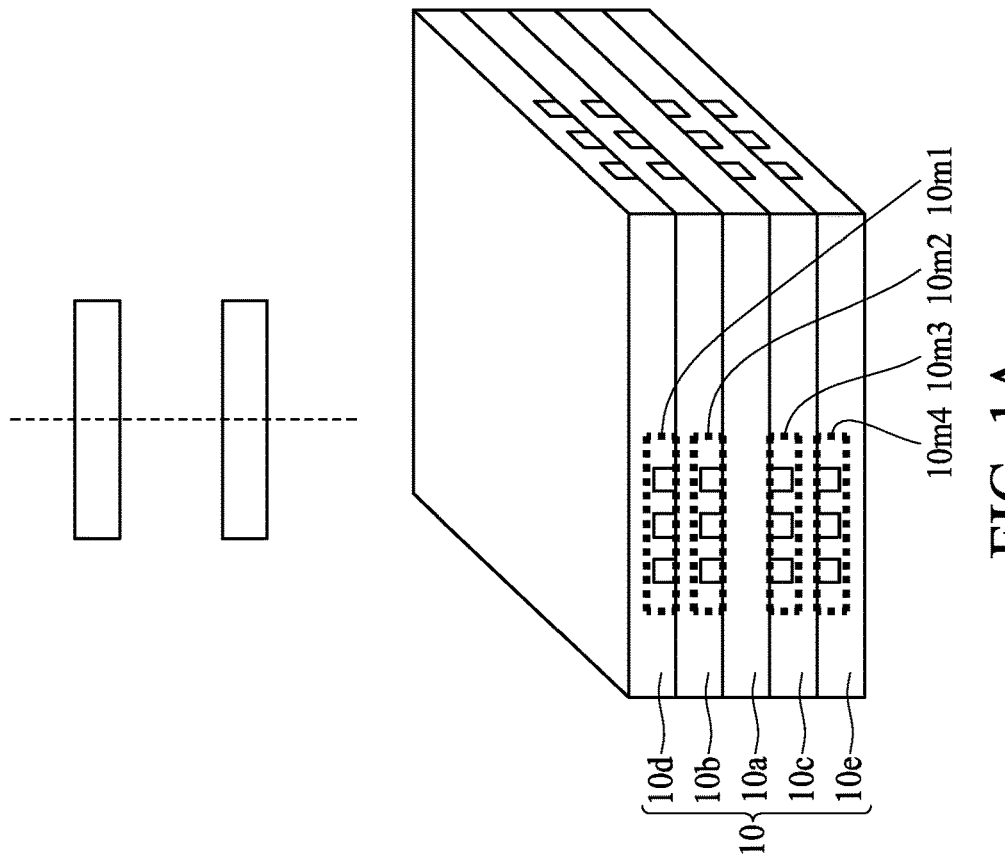

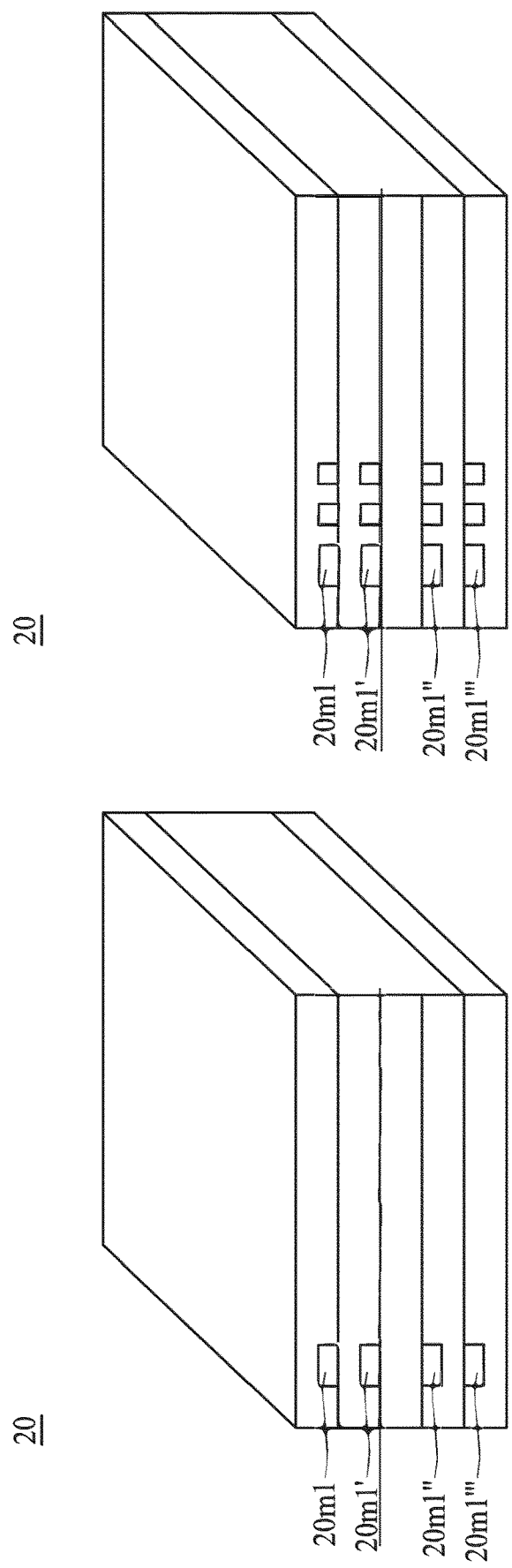

SEMICONDUCTOR DEVICE PACKAGE AND METHOD OF MANUFACTURING THE SAME

CROSS-REFERENCE TO RELATED APPLICATIONS

This application claims the benefit of, and priority to, U.S. Provisional Application No. 62/748,172, filed Oct. 19, 2018, the contents of which are incorporated herein by reference in their entireties.

BACKGROUND

1. Technical Field

The present disclosure relates to a semiconductor device package and a method of manufacturing the same, and to a semiconductor device package including a multi-layered substrate and a method of manufacturing the same.

2. Description of the Related Art

A multi-layered substrate is widely used in many semiconductor device packages. The multi-layered substrate may include multiple layers (e.g., dielectric layers). Each of the layers has a patterned conductive layer. The alignment between any two layers of the substrate can be important in obtaining better performance.

SUMMARY

In accordance with some embodiments of the present disclosure a package substrate includes a first dielectric layer, a first patterned conductive layer and a first set of alignment marks. The first patterned conductive layer is disposed on the first dielectric layer. The first set of alignment marks is disposed on the first dielectric layer and adjacent to a first edge of the first dielectric layer. The first set of alignment marks includes a plurality of alignment marks. Distances between the alignment marks of the first set of alignment marks and the first edge are different from each other.

In accordance with some embodiments of the present disclosure a method for manufacturing a semiconductor device package includes (a) providing a substrate; (b) disposing an electronic component on the substrate; and (c) forming a package body on the substrate to cover the electronic component. The substrate includes a first dielectric layer, a first patterned conductive layer and a first set of alignment marks. The first patterned conductive layer is disposed on the first dielectric layer. The first set of alignment marks is disposed on the first dielectric layer and adjacent to a first edge of the first dielectric layer. The first set of alignment marks includes a plurality of alignment marks. Lengths of the alignment marks of the first set of alignment marks are different from each other.

In accordance with some embodiments of the present disclosure a method for manufacturing a semiconductor device package includes (a) providing a substrate; (b) disposing an electronic component on the substrate; and (c) forming a package body on the substrate to cover the electronic component. The substrate has a first dielectric layer, a first patterned conductive layer and a first set of alignment marks. The first patterned conductive layer is disposed on the first dielectric layer. The first set of alignment marks is disposed on the first dielectric layer and adjacent to a first edge of the first dielectric layer. The first set of alignment marks includes a plurality of alignment marks. Distances between the alignment marks of the first set of alignment marks and the first edge are different from each other.

BRIEF DESCRIPTION OF THE DRAWINGS

FIG. 1A illustrates a perspective view of a substrate in accordance with certain comparative techniques.

FIG. 1B illustrates a perspective view of a substrate in accordance with certain comparative techniques.

FIG. 3A illustrates a perspective view of a substrate in accordance with some embodiments of the present disclosure.

FIG. 3B illustrates a perspective view of a substrate in accordance with some embodiments of the present disclosure.

Figure 1C:
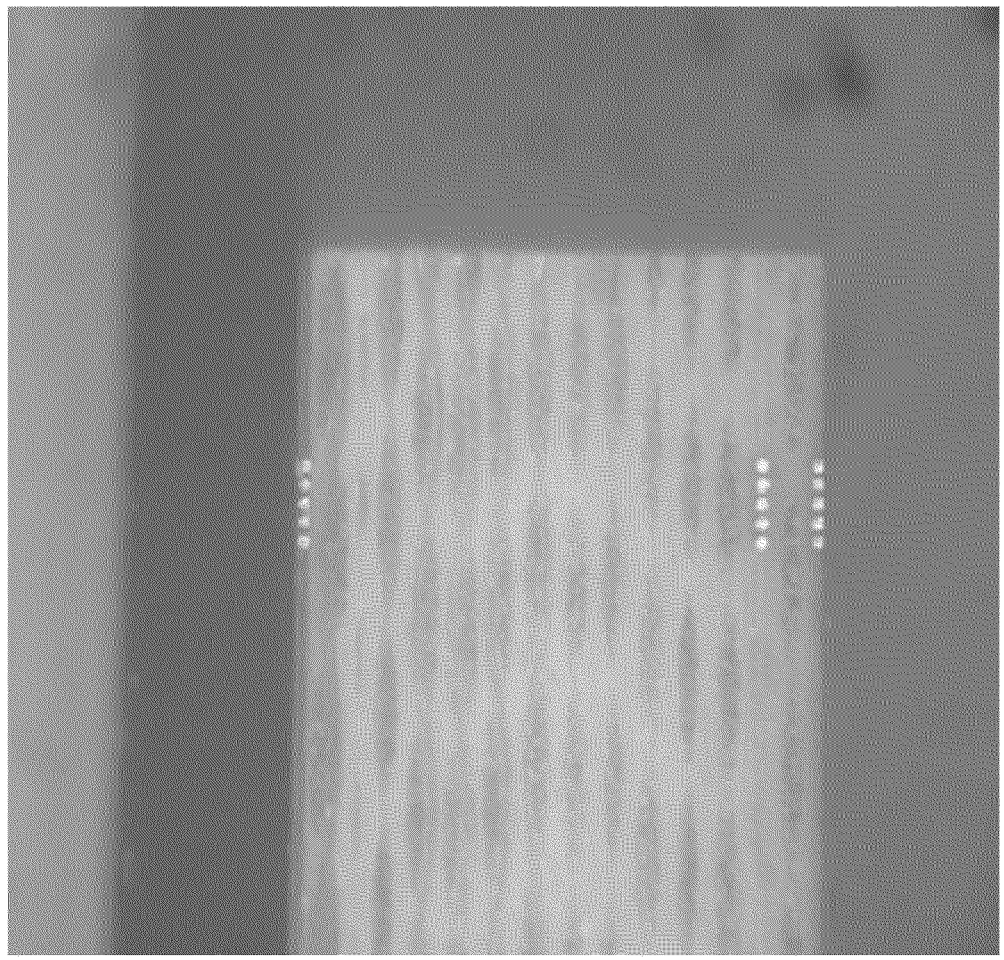
FIG. 1C is an image showing a cross-sectional view of a substrate in accordance with certain comparative techniques.

Common reference numerals are used throughout the drawings and the detailed description to indicate the same or similar components. The present disclosure will be readily understood from the following detailed description taken in conjunction with the accompanying drawings.

DETAILED DESCRIPTION

FIG. 1A illustrates a cross-sectional view of a substrate package in accordance with certain comparative techniques. The substrate package includes a substrate 10 and patterned conductive layers (e.g., redistribution layers (RDLs) or antenna patterns) disposed within the substrate 10. The substrate 10 may be a multi-layered substrate including a core structure 10a, dielectric layers 10b, 10c and protective layers 10d, 10e (e.g., layers including a solder resist or a solder mask). The core structure 10a may be, for example, selected from, but not limited to, a silicon substrate, a plastic substrate, or a ceramic substrate. The dielectric layers 10b and 10c are respectively disposed on a top surface and a bottom surface of the core structure 10a. Each of the dielectric layers 10b and 10c may include a material such as a polypropylene (PP), a bismaleimide-triazine (BT) resin, an epoxy, a polyimide (PI) or other dielectric materials. The dielectric layers 10b and 10c may include a same material as each other or may include different materials. In other embodiments, the substrate 10 may be a coreless multi-layered substrate that omits a core structure and that includes a plurality of dielectric layers (or sub-layers).

One or more layers of the substrate 10 include patterned conductive layers. For example, as shown in FIG. 1A, the patterned conductive layers may be disposed on the core structure 10a and the dielectric layers 10b and 10c. For example, the patterned conductive layers may be disposed on both surfaces of the core structure 10a. For example, the patterned conductive layer may be disposed on a top surface of the dielectric layer 10b and covered by the protective layer 10d. For example, the patterned conductive layer may be disposed on a bottom surface of the dielectric layer 10c and covered by the protective layer 10e.

The substrate 10 includes one or more sets of alignment marks (e.g., a first set of alignment marks 10m1, a second set of alignment marks 10m2, a third set of alignment marks 10m3, and a fourth set of alignment marks 10m4 on lateral surfaces of the layers of the substrate 10), and each of the sets of alignment marks has a same number of alignment marks. The pitches of the alignment marks are substantially the same. For example, the distances between any two adjacent alignment marks are substantially the same. The widths of the alignment marks are substantially the same. In some embodiments, the width of each alignment mark is about 20 micrometers (μm).

The sets of alignment marks 10m1, 10m2, 10m3 and 10m4 can be used to determine whether the layers of the substrate 10 (and the patterned conductive layers within the substrate 10) are aligned with each other. For example, as shown in FIG. 1A, the alignment marks 10m1, 10m2, 10m3 and 10m4 of the substrate 10 are aligned with each other, and thus it is determined that the layers of the substrate 10 (and the patterned conductive layers within the substrate 10) are aligned with each other. In other words, a shift, a deviation, or a drift is minimized or reduced in the layers of the substrate 10.

As shown in FIG. 1B, the set of alignment marks 10m2 (second from the top) is misaligned with the other sets of alignment marks 10m1, 10m3 and 10m4, and thus it is determined that the core structure 10a on which the set of alignment marks 10m2 is disposed has a shift, a deviation, or a drift. The distance or amount of the shift, deviation, or drift of the layer 10b can be determined based on the position of the set of alignment marks 10m2 relative to the position of the set of alignment marks 10m1 or 10m3.

Due to limitations in manufacturing alignment marks, a pitch of alignment marks may be limited (e.g., a minimum pitch of the alignment marks is about 20 μm to about 25 μm), which reduces the accuracy for determining the shift, deviation, or drift. In addition, as shown in FIG. 1C, which is an image showing a substrate including alignment marks, it can be difficult to measure a shifting distance of the alignment marks.

Figure 2:
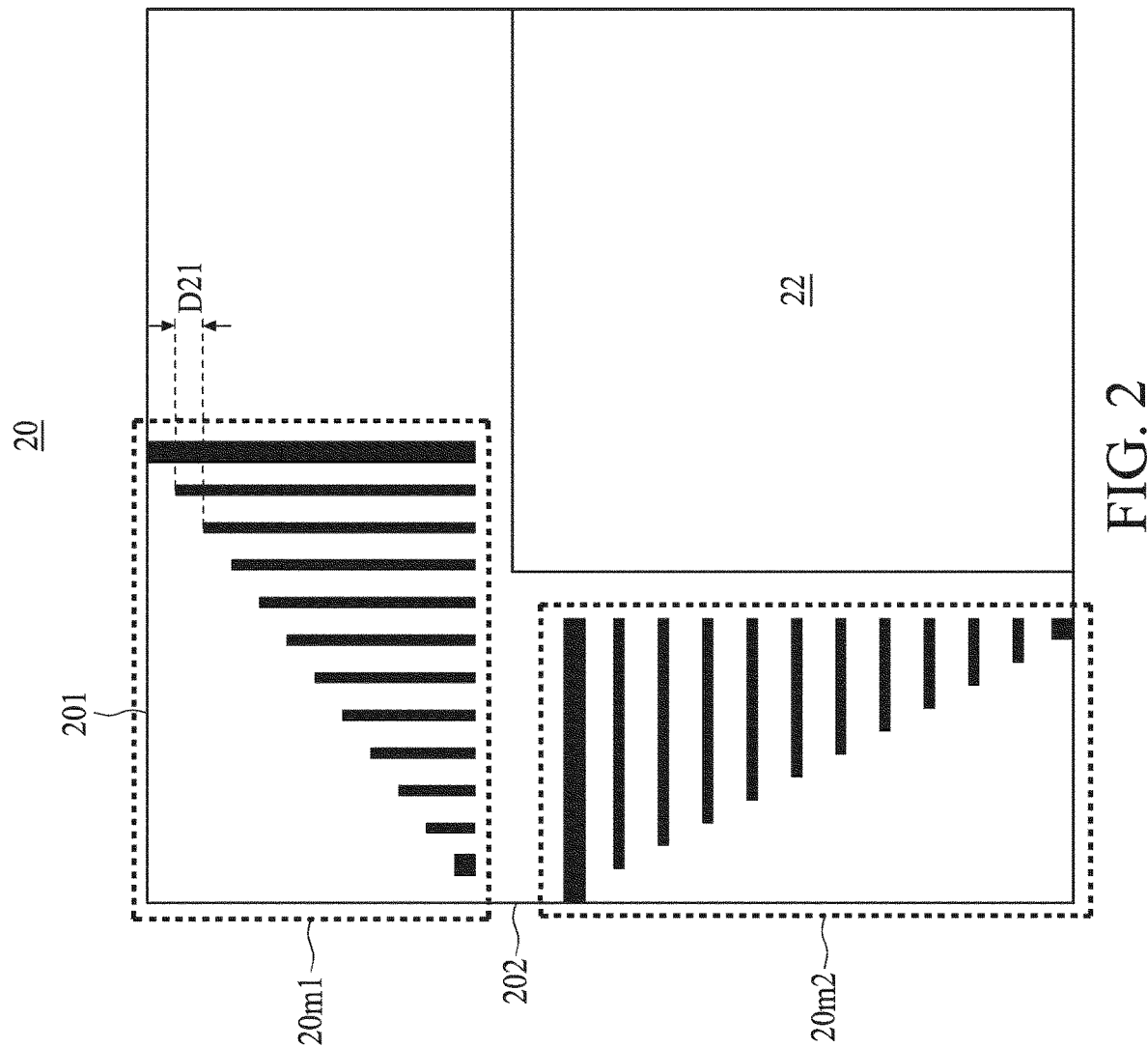
FIG. 2 illustrates a top view of one layer of a substrate in accordance with some embodiments of the present disclosure.

FIG. 2 illustrates a top view of a portion of one layer (e.g., one quarter of the layer) of a multi-layered substrate (e.g., a substrate 20 as shown in FIG. 3A or FIG. 3B), in accordance with some embodiments of the present disclosure. The substrate 20 illustrated in FIG. 2 is similar to the substrate 10 illustrated in FIG. 1A, and some descriptions of the substrate 10 can be applicable to the substrate 20 in FIG. 2. The depicted layer of the substrate 20 includes a circuit region 22 (which may extend beyond the bottom right corner of the layer shown in FIG. 2). In some embodiments, the circuit region 22 may be or may include an RDL, an antenna pattern and/or a chip-bonding region. The circuit region 22 is spaced apart from the edges of the layer of the substrate 20. For example, there is a distance between each of the edges of the layer of the substrate 20 and the circuit region 22. In some embodiments, the distance between each of the edges of the layer of the substrate 20 and the circuit region 22 is about 100 μm to about 150 μm.

The layer of the substrate 20 includes sets of alignment marks 20m1, 20m2, and each set of alignment marks includes multiple alignment marks. It is noted that in some other embodiments, a substrate or a layer of a substrate may include a single (only one) set of alignment marks. The sets of alignment marks 20m1 and 20m2 are located at a space (e.g., a side rail) between the edges of the layer of the substrate 20 and the circuit region 22. The set of alignment marks 20m1 is disposed along an edge 201. The set of alignment marks 20m2 is disposed along an edge 202. As shown in FIG. 2, the lengths of the alignment marks of the sets of the alignment marks 20m1 and 20m2 are different from each other. For example, the lengths of the alignment marks of the set of alignment marks 20m1 gradually increase (e.g., monotonically increase) from the edge 202 to the circuit region 22 (e.g., in a direction from an outer edge toward a central portion). In some embodiments, a length difference D21 between two adjacent alignment marks is about 2 μm to about 5 μm. Any two adjacent alignment marks are spaced apart from each other by a substantially same distance. In some embodiments, the alignment marks are of substantially the same width (e.g., about 30 μm to about 50 μm). Alternatively, the width of the alignment marks can be adjusted depending on design specifications. For example, one set of the alignment marks may include nine alignment marks, wherein the first alignment mark has a first width (e.g., about 50 μm), the second alignment mark to the fourth alignment marks have a second width (e.g., about 30 μm), the fifth alignment mark has the first width (e.g., about 50 μm), and the sixth alignment mark to the ninth alignment mark have the second width (e.g., about 30 μm). In some embodiments, a last alignment mark (e.g. a longest alignment mark) may have a width different from the width of any other alignment marks to indicate an end point. In some embodiments, a difference of the lengths of two adjacent alignment marks of a set of alignment marks is substantially equal to a difference of the lengths of any other two adjacent alignment marks of the set of alignment marks The substrate 20 may include multiple layers, each having a patterned conductive layer and alignment marks identical to and/or similar to those shown in FIG. 2. The multiple layers are stacked together to form a multi-layered substrate 20 as shown in FIG. 3A or FIG. 3B. The circuit region 22 and the sets of alignment marks 20m1, 20m2 of the layers of the substrate 20 are aligned with each other. If there is little or no shift, deviation, or drift occurring in any of the layers of the substrate 20, each layer of the substrate 20 should have the same number of the alignment marks (e.g., 20m1, 20m1', 20m1" and 20m1'" should have the same number of alignment marks) on its lateral surface as shown in FIG. 3A or FIG. 3B. For example, as shown in FIG. 3A, each of the layers of the substrate 20 has one alignment mark on its lateral surface, and thus it is determined that no shift, deviation, or drift is occurring in any of the layers of the substrate 20. Similarly, as shown in FIG. 3B, each of the layers of the substrate 20 has three alignment marks on its lateral surface, and thus it is determined that no shift, deviation, or drift is occurring in any of the layers of the substrate 20.

One of the differences between the structure in FIG. 3A and the structure in FIG. 3B is the number of the alignment marks showing on the lateral surface of each layer of the substrate 20. One of the reasons why the number of the alignment marks exposed from the lateral surface of each layer of the substrate 20 illustrated in FIG. 3A and FIG. 3B is that when performing a singulation operation on a substrate strip, the cutting device used for the substrate 20 illustrated in FIG. 3B is relatively wider.

Figure 4A:
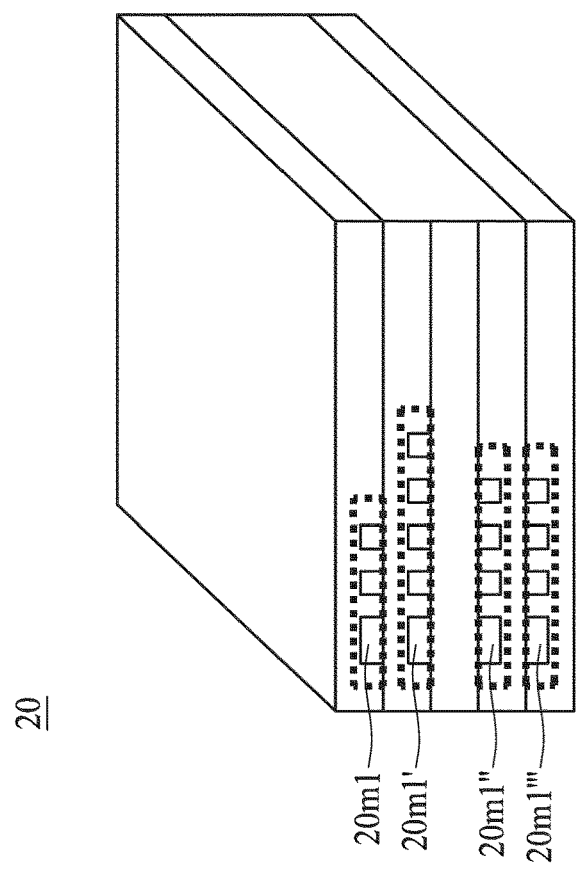
FIG. 4A illustrates a perspective view of a substrate in accordance with some embodiments of the present disclosure.
Figure 4B:
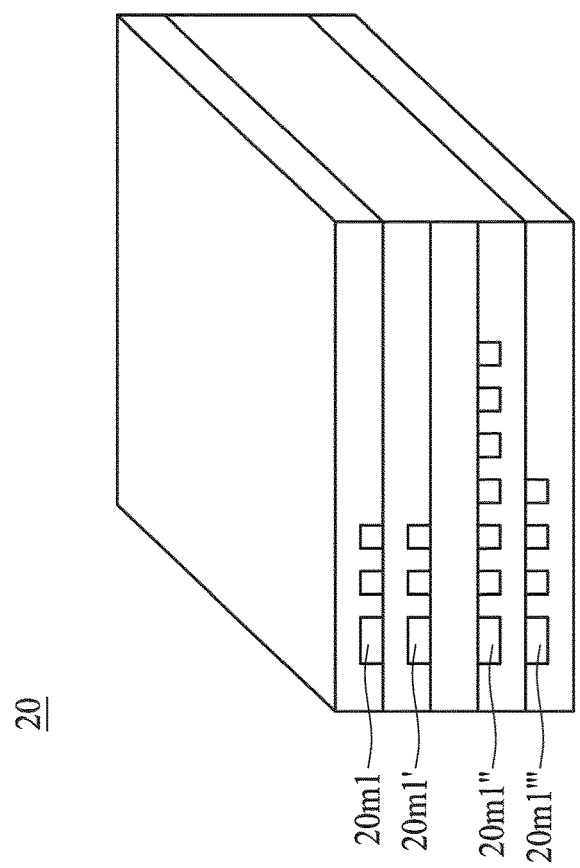
FIG. 4B illustrates a perspective view of a substrate in accordance with some embodiments of the present disclosure.

FIG. 4A and FIG. 4B illustrate a perspective view of the substrate 20 in the case that shift, deviation, or drift occurs for one of the layers of the substrate 20, in accordance with some embodiments of the present disclosure. As shown in FIG. 4A and FIG. 4B, the number of alignment marks of one set of alignment marks on the lateral surface of one layer of the substrate 20 is different from the number of alignment marks of other sets of alignment marks on the lateral surfaces of other layers of the substrate 20. For example, as shown in FIG. 4A, the number of alignment marks of the set of alignment marks 20m1' on the lateral surface of the layer of the substrate 20 is different from (more than) the number of alignment marks of other sets of alignment marks 20m1, 20m1" and 20m1'" on the lateral surfaces of other layers of the substrate 20, and thus it is determined that there is a shift, a deviation, or a drift occurring for the layer on which the set of alignment marks 20m1' is located. Similarly, as shown in FIG. 4B, the number of alignment marks of the set of alignment marks 20m1" on the lateral surface of the layer of the substrate 20 is different from (more than) the number of alignment marks of other sets of alignment marks 20m1, 20m1' and 20m1'" on the lateral surfaces of other layers of the substrate 20, and thus it is determined that there is a shift, a deviation, or a drift occurring for the layer on which the set of alignment marks 20m1" is located. In other words, whether the shift, deviation, or drift occurs for the layers of the substrate 20 can be determined based on the number of the alignment marks shown on the lateral surfaces of the layers of the substrate 20.

In addition, the distance of the shift, deviation, or drift of the layer of the substrate 20 can be determined based on the number of alignment marks of the shifted layer relative to the number of alignment marks of any other unshifted layers. For example, as shown in FIG. 4A, the layer on which the set of alignment marks 20m1' is located has two more alignment marks on its lateral surface than the number of alignment marks of other sets of alignment marks 20m1, 20m1" and 20m1'" on the lateral surfaces of other layers. Therefore, the shifting distance of the shifted layer relative to other unshifted layers is 2×N, where N is the length difference between two adjacent alignment marks. For example, if N is 5 μm, the shifting distance of the second layer is about 10 μm. Similarly, as shown in FIG. 4B, the layer on which the set of alignment marks 20m1" is located has four more alignment marks on its lateral surface than the number of the alignment marks of other sets of alignment marks 20m1' 20m1' and 20m1'" on the lateral surfaces of other layers. Therefore, the shifting distance of the third layer relative to other layers is 4×N, where N is the length difference between two adjacent alignment marks.

Figure 5:
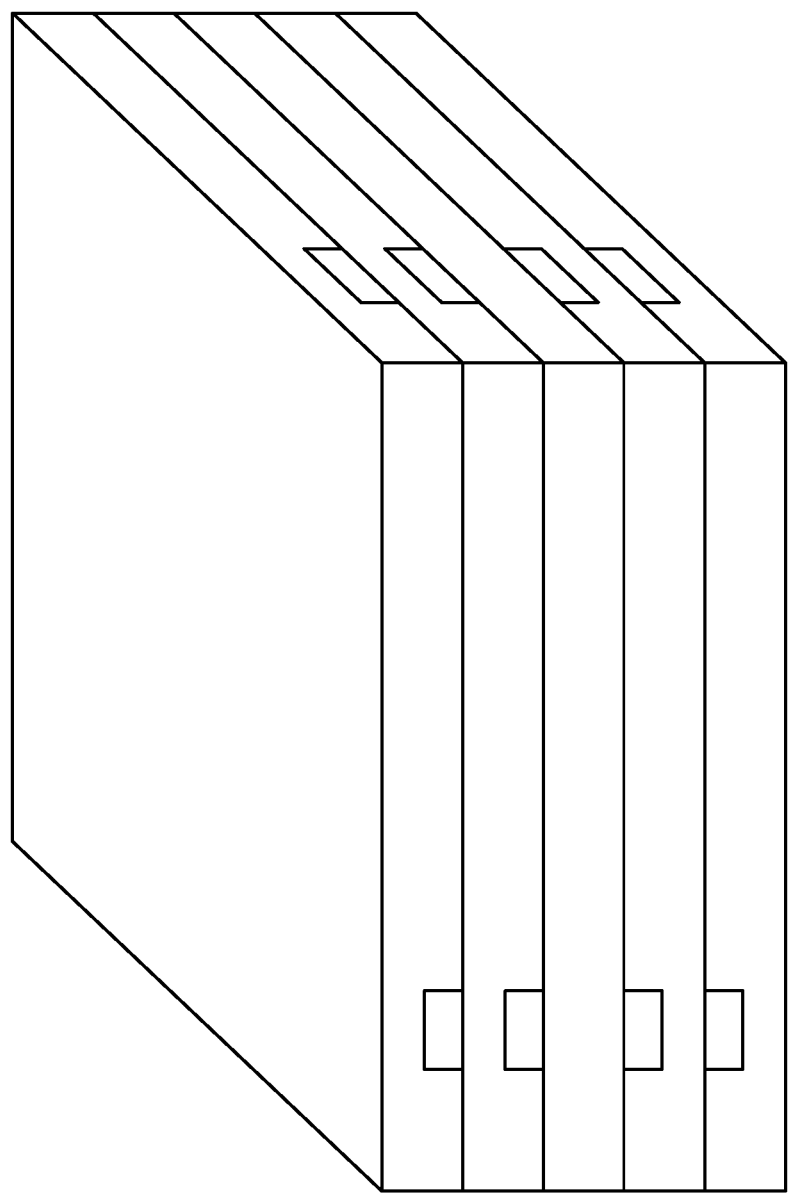
FIG. 5 illustrates a perspective view of a substrate in accordance with some embodiments of the present disclosure.

In some embodiments, the alignment marks can be shown on two adjacent lateral surfaces of each layer of a substrate 20, as shown in FIG. 5, to measure the shift, deviation, or drift of the layer in both the x-direction and the y-direction.

Figure 6A:
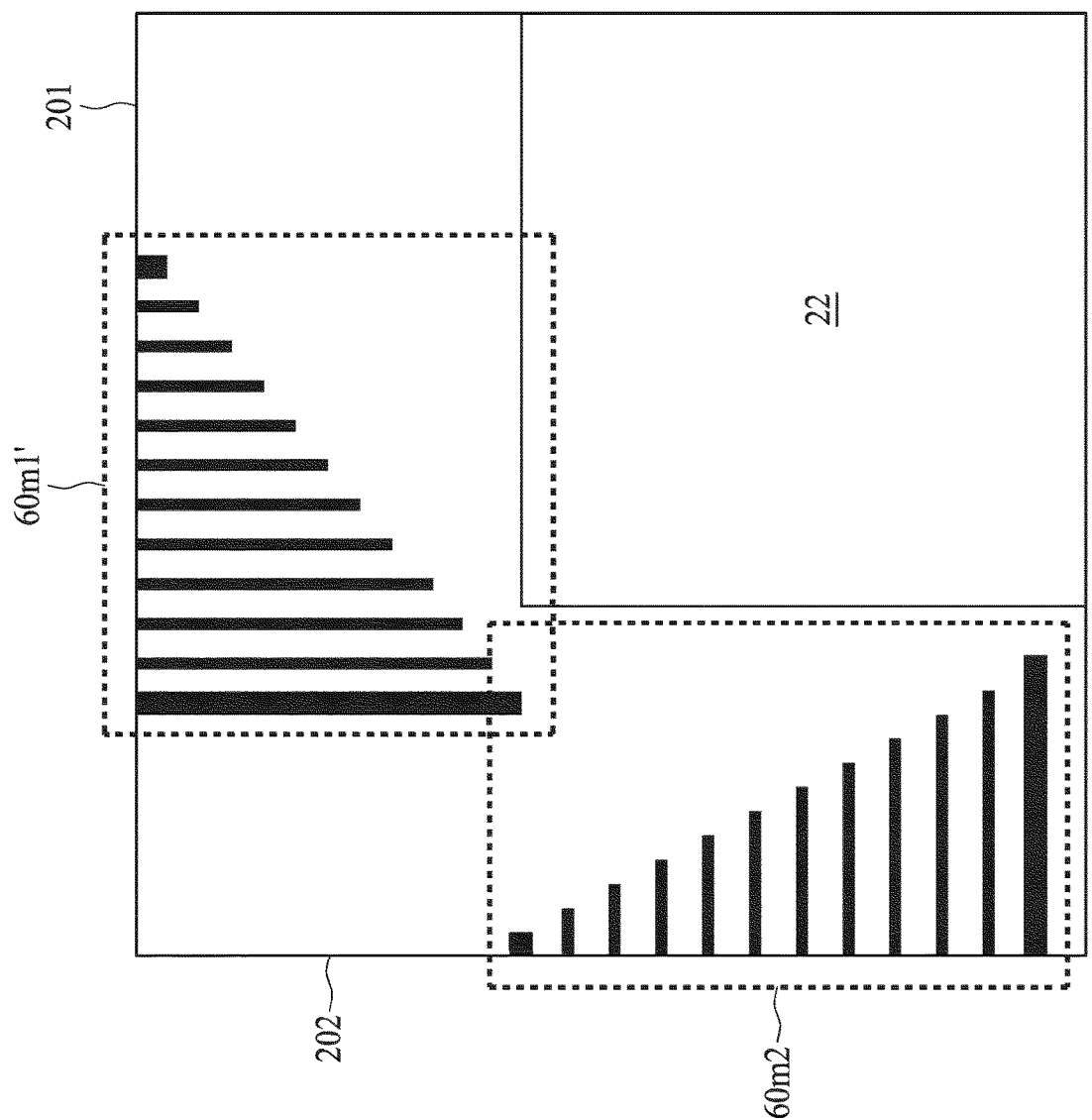
FIG. 6A illustrates a top view of one layer of a substrate in accordance with some embodiments of the present disclosure.
Figure 6B:
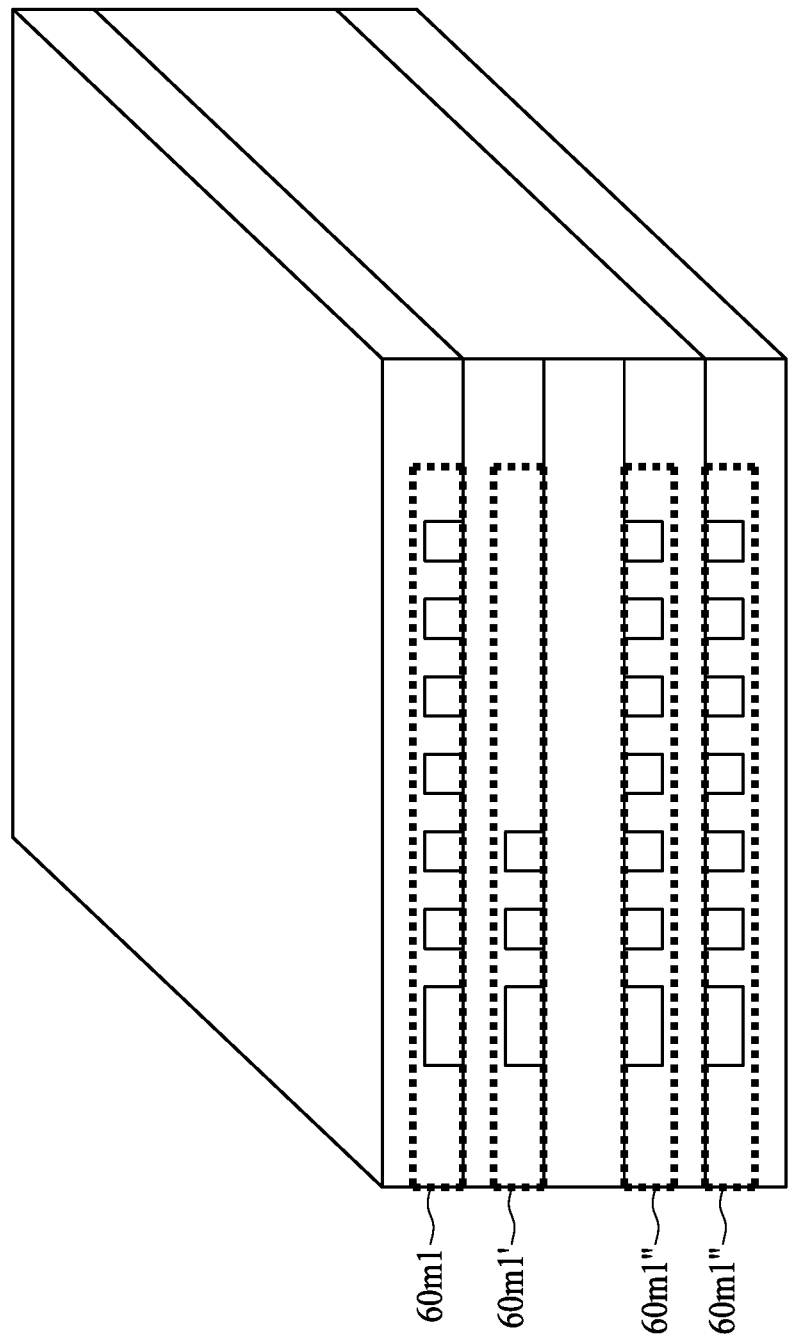
FIG. 6B illustrates a perspective view of a substrate in accordance with some embodiments of the present disclosure.

FIG. 6A illustrates a top view of a portion of one layer (e.g., one quarter of the layer) of a multi-layered substrate in accordance with some embodiments of the present disclosure. The structure illustrated in FIG. 6A is similar to that in FIG. 2, and one of the differences therebetween is that the alignment marks of the sets of alignment marks 60m1 and 60m2 illustrated in FIG. 6A are respectively aligned with the edges 201 and 202 of the layer of the substrate in the depicted manner. Therefore, as shown in FIG. 6B, if the shift, deviation, or drift occurs for one layer of the substrate, the number of the alignment marks on the lateral surface of the shifted layer (e.g., the layer on which the set of alignment marks 60m1' is located) of the substrate is less than the number of the alignment marks of the sets of alignment marks 60m1, 60m1" and 60m1'" on the lateral surface of other unshifted layers of the substrate.

In accordance with the embodiments of FIG. 2, FIG. 3A, FIG. 3B, FIG. 4A, FIG. 4B, FIG. 5, FIG. 6A and FIG. 6B, since the shifting distance is determined by the number of the alignment marks shown on the lateral surface of the shifted layer relative to the number of the alignment marks shown on the lateral surface of unshifted layers, it is possible to readily and accurately measure the shifting distance. In addition, the means for determining the shifting distance is determined by the difference in length between two adjacent alignment marks—rather than by the width of the alignment mark as shown in FIGS. 1A and 1B—which can provide for greater accuracy in determining the shifting distance.

FIG. 7A, FIG. 7B, FIG. 7C and FIG. 7D illustrate a method of manufacturing a semiconductor device package in accordance with some embodiments of the present disclosure.

Figure 7A:
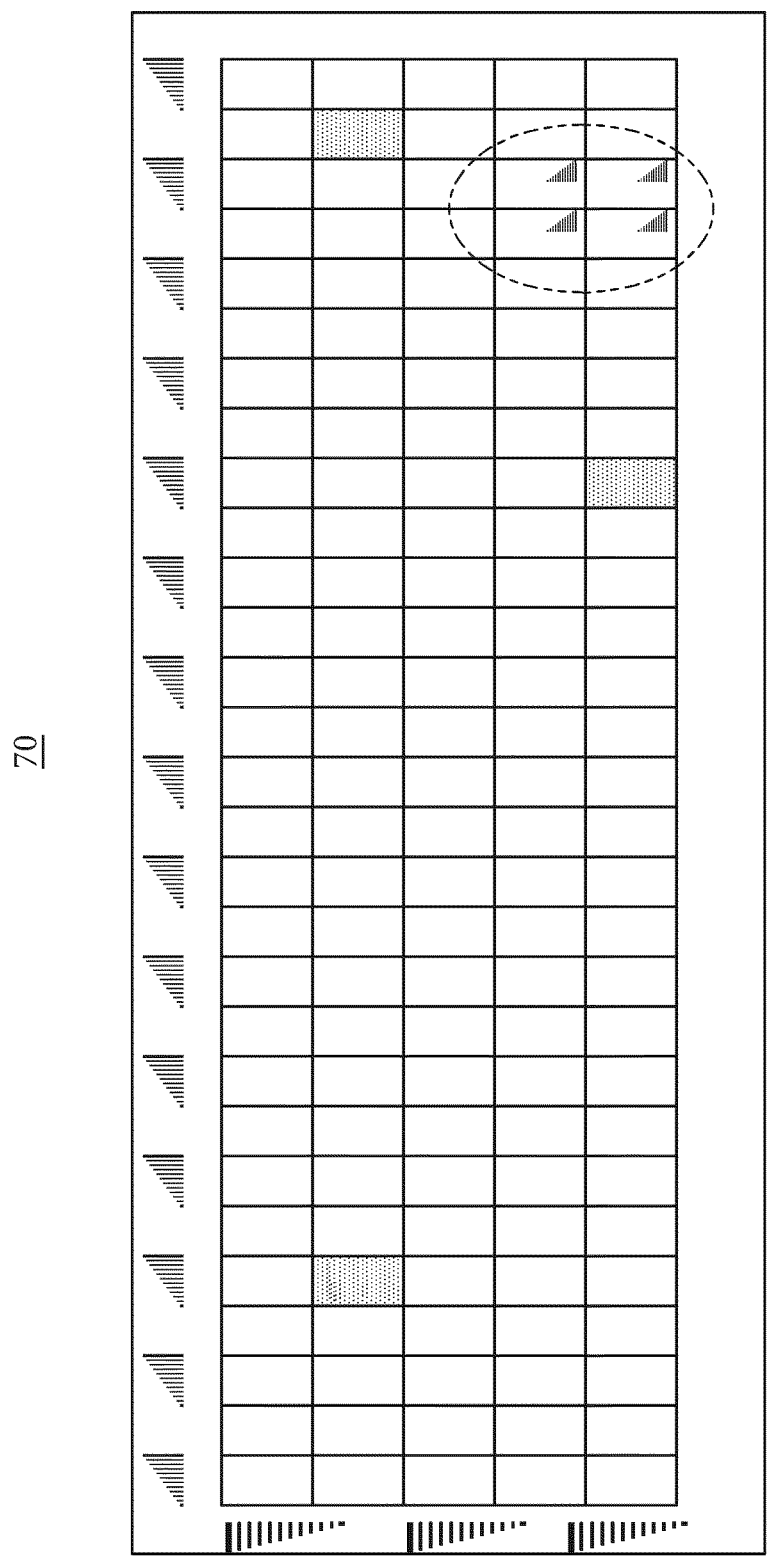
FIG. 7A, FIG. 7B, FIG. 7C and FIG. 7D illustrate a method of manufacturing a semiconductor device package in accordance with some embodiments of the present disclosure.

Referring to FIG. 7A, a substrate strip 70 including a plurality of multi-layered substrates (e.g., the substrate 20) is provided. As shown in FIG. 7, the alignment marks can be disposed at locations corresponding to each row and column of the substrates. In other embodiments, the alignment marks can be disposed selectively (e.g. at four corners or edges of the substrate strip 70). In some embodiments, each substrate of the substrate strip 70 may also include alignment marks. Therefore, it is easier to determine which column or row of substrates includes a shift, a deviation, or a drift. In addition, if one column or row of substrates is determined to include the shift, deviation, or drift, it is easier to determine which substrate in the column or row of substrates includes the shift, deviation, or drift.

Figure 7B:
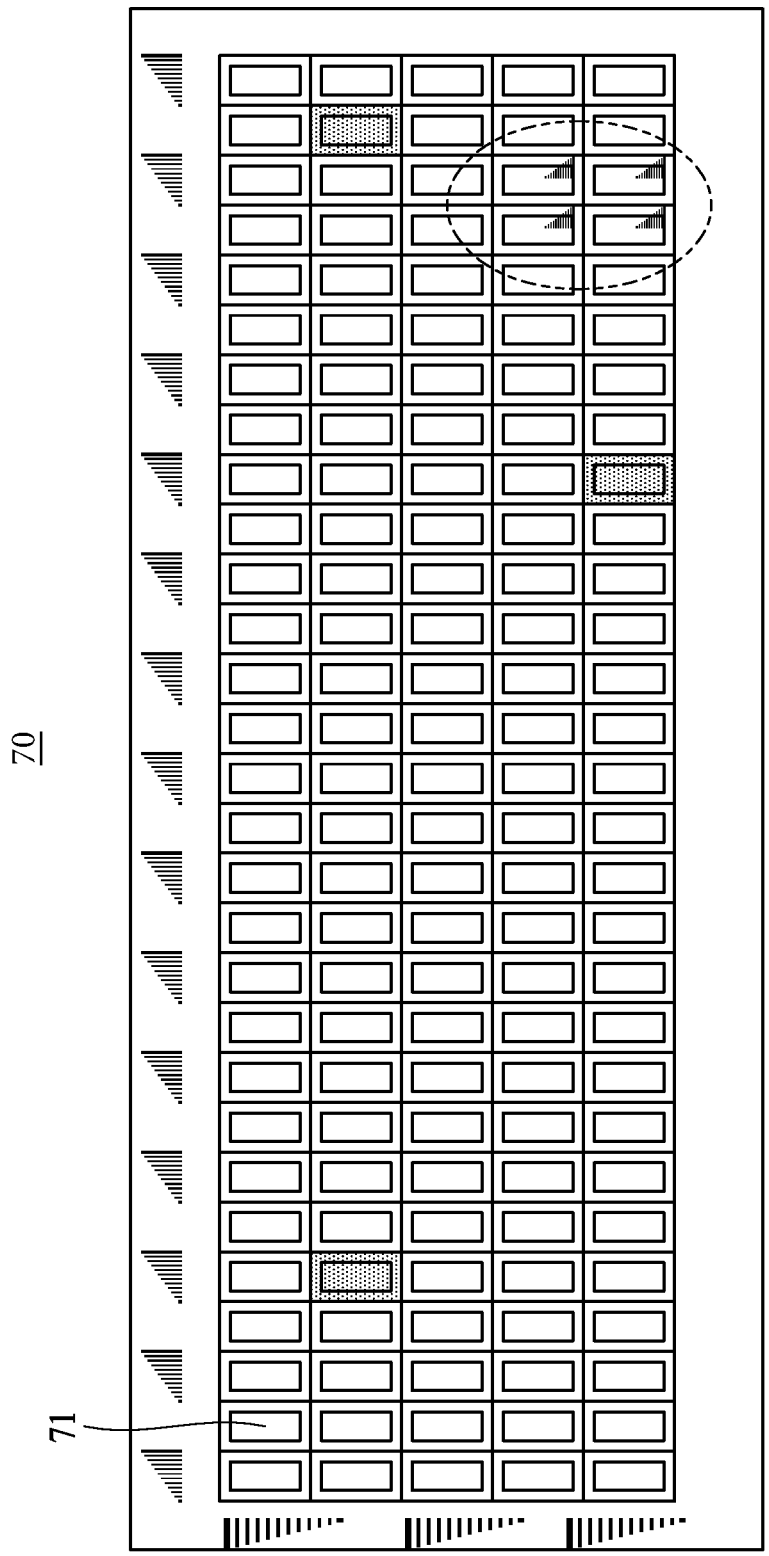

Referring to FIG. 7B, electronic components 71 (e.g., dies or chips) are bonded to each of the substrates.

Figure 7C:
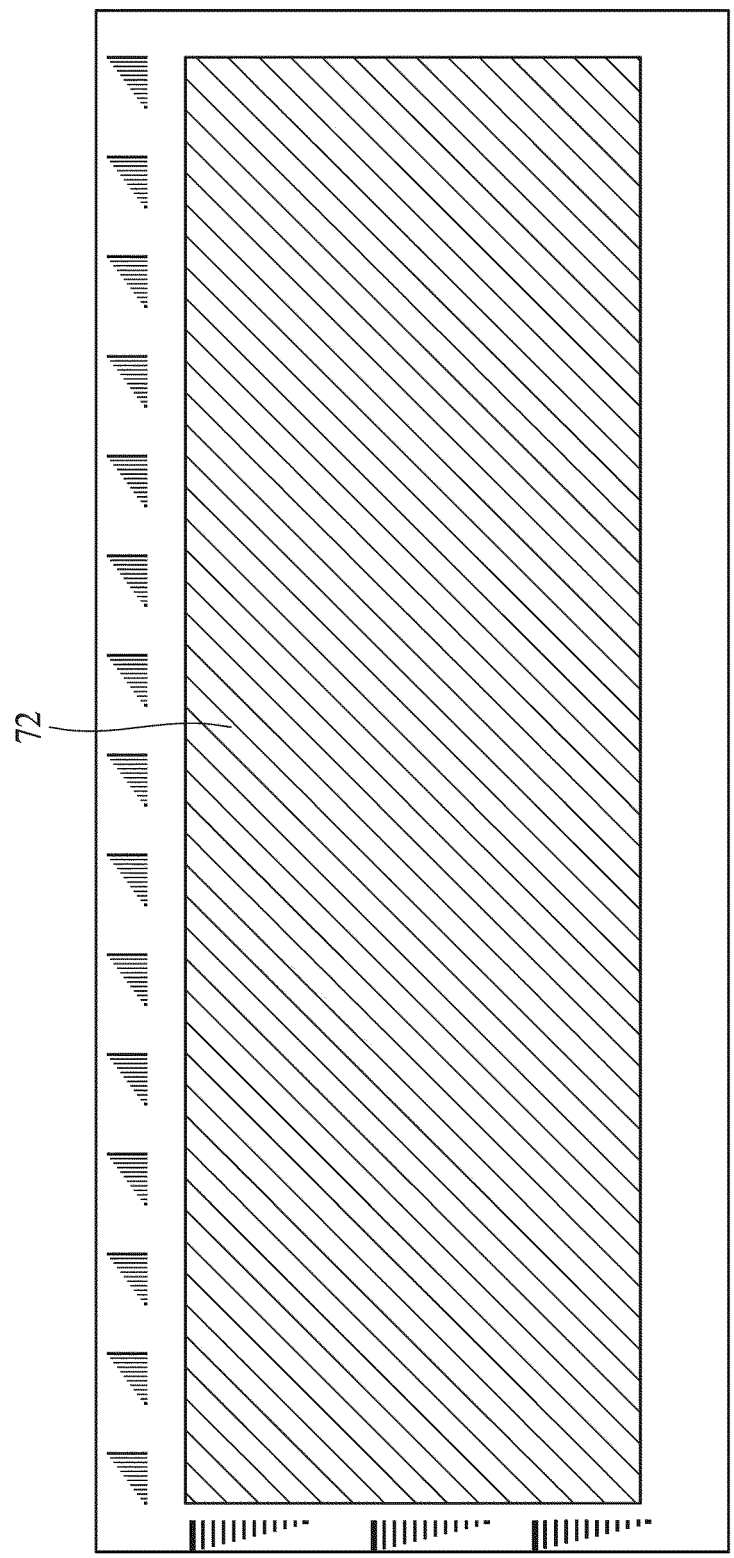

Referring to FIG. 7C, a package body 72 is formed on the substrate strip 70 to cover or encapsulate the electronic components 71. In some embodiments, the package body 72 can be formed by, for example, transfer molding, compression molding or any other molding techniques.

Figure 7D:
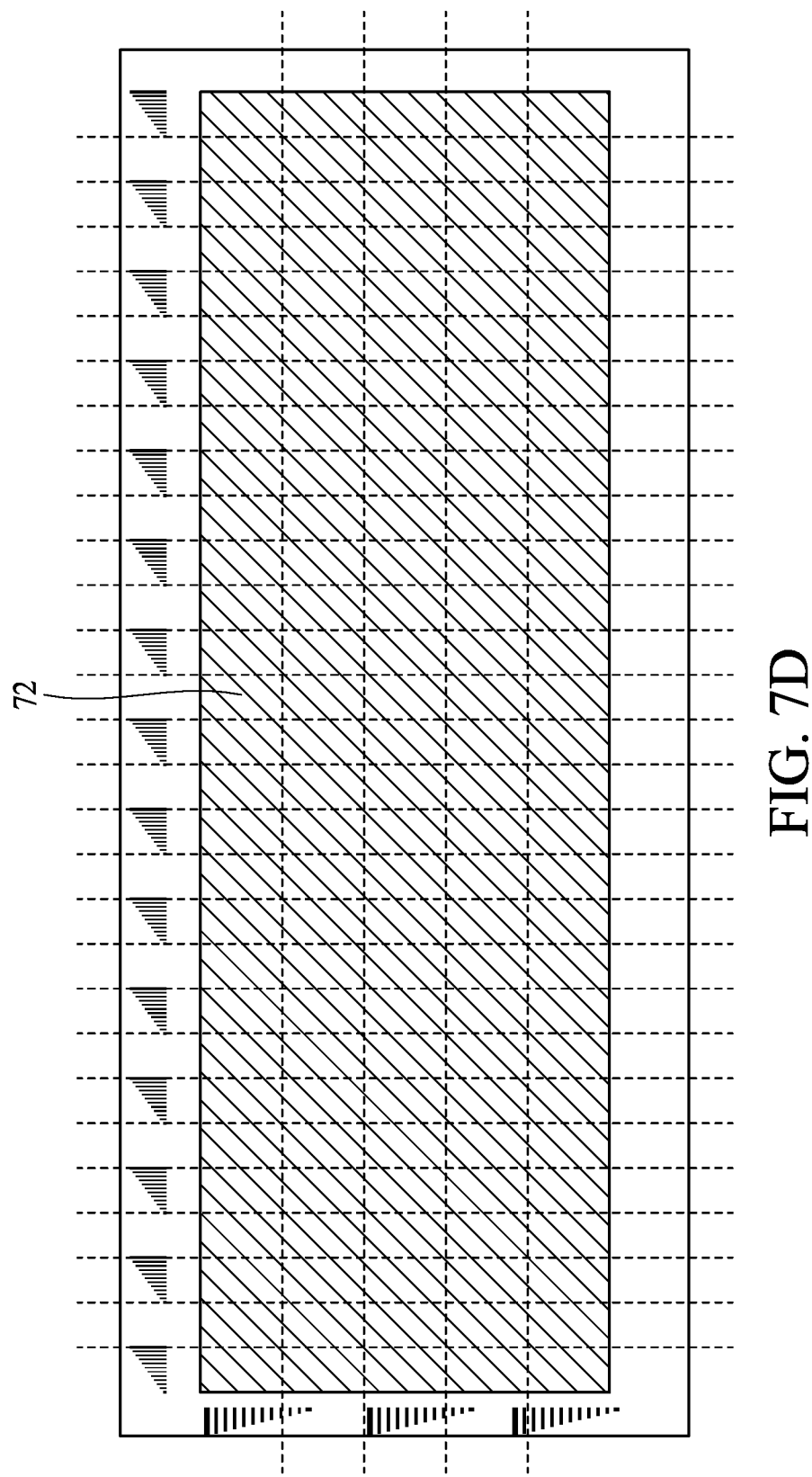

Referring to FIG. 7D, singulation may be performed to separate out individual semiconductor package devices. That is, the singulation is performed through the package body 72 and the substrate strip 70 including a plurality of multi-layered substrates (e.g., the substrate 20). The singulation may be performed, for example, by using a dicing saw, laser or other appropriate cutting technique.

Figure 8:
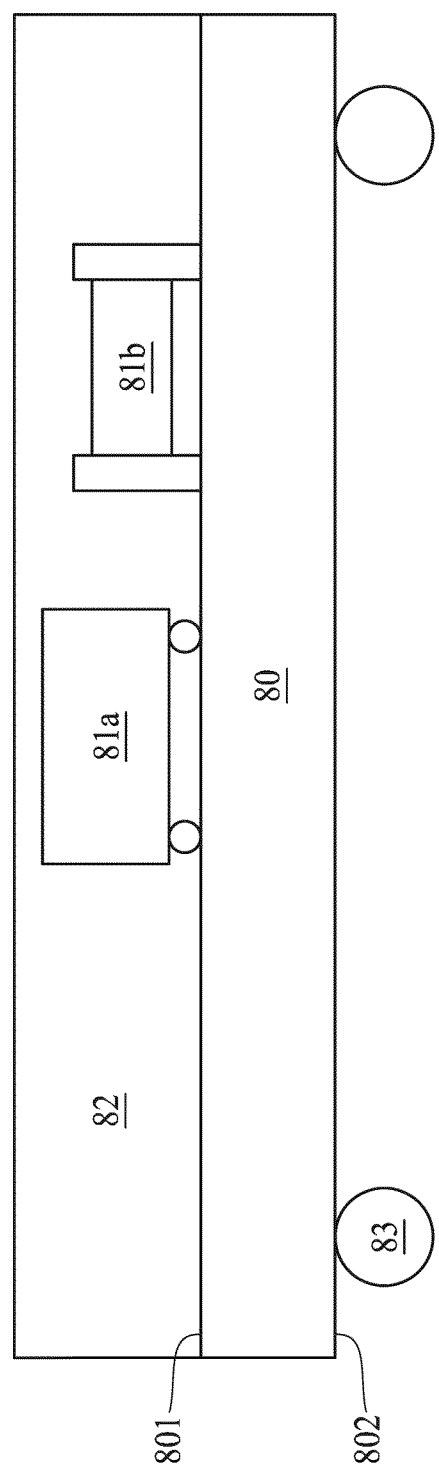
FIG. 8 illustrates a cross-sectional view of a semiconductor device package in accordance with some embodiments of the present disclosure.

FIG. 8 illustrates a semiconductor device package 8 in accordance with some embodiments of the present disclosure. The semiconductor device package 8 includes a substrate 80, electronic components 81a, 81b, a package body 82 and electrical contacts 83. In some embodiments, the semiconductor device package 8 can be formed using the operations shown in FIG. 7A, FIG. 7B, FIG. 7C and FIG. 7D or any other appropriate manufacturing processes.

In some embodiments, the substrate 80 is a multi-layered substrate. For example, the substrate 80 may be or may include the substrate 10 or 20 illustrated in any of FIG. 1A, FIG. 1B, FIG. 2, FIG. 3A, FIG. 3B, FIG. 4A, FIG. 4B, FIG. 5, FIG. 6A and FIG. 6B. The substrate 80 has a surface 801 and a surface 802 opposite to the surface 801.

The electrical components 81a and 81b are disposed on a top surface 801 of the substrate 80. The electrical component 81a may be an active component, such as an integrated circuit (IC) chip or a die. The electrical component 81b may be a passive electrical component, such as a capacitor, a resistor or an inductor. Each electrical component 81a and 81b may be electrically connected to one or more of another electrical component 81a and 81b and/or to the substrate 80 (e.g., to the RDL), and electrical connection may be attained by way of flip-chip or wire-bond techniques.

The package body 82 is disposed on the surface 801 of the substrate 80 and encapsulates a part of the surface 801 of the substrate 80 and the electrical components 81a and 81b. In some embodiments, the package body 82 includes an epoxy resin having fillers dispersed therein.

The electrical contacts 83 (e.g. a solder ball) are disposed on the surface 802 of the substrate 80 and can provide electrical connections between the semiconductor device package 8 and external components (e.g. external circuits or circuit boards). In some embodiments, the electrical contacts 83 include a controlled collapse chip connection (C4) bump, a ball grid array (BGA) or a land grid array (LGA).

In some embodiments, the semiconductor device package 8 may be formed by processes that include the following: (i) providing the substrate 80; (ii) disposing the electronic components 81a and 81b on the surface 801 of the substrate 80; (iii) forming the package body 82 on the surface 801 of the substrate 80 to cover the electronic components 81a and 81b; and (iv) forming the electronic components 83 on the surface 802 of the substrate 80.

As used herein, the terms "substantially," "substantial," "approximately," and "about" are used to denote and account for small variations. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a thickness of a film or a layer being "substantially uniform" can refer to a standard deviation of less than or equal to ±10% of an average thickness of the film or the layer, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 µm, within 30 µm, within 20 µm, within 10 µm, or within 1 µm of lying along the same plane. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and the like. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A method for manufacturing a substrate, comprising:
   (a) providing a first dielectric layer and a first set of alignment marks at a first surface of the first dielectric layer, wherein the first dielectric layer has a first edge, and wherein distances between the first set of alignment marks and the first edge of the first dielectric layer vary; and
   (b) providing a second dielectric layer over the first dielectric layer and a second set of alignment marks at a first surface of the second dielectric layer, wherein the second dielectric layer has a second edge, and wherein distances between the second set of alignment marks and the second edge of the second dielectric layer vary, wherein lengths of the first set of alignment marks are in ascending order along a first direction, and lengths of the second set of alignment marks are in ascending order substantially along the first direction.

2. The method of claim 1, wherein differences between the lengths of any two adjacent alignment marks of the first set of alignment marks are substantially equal.

3. The method of claim 1, wherein centers of widths of any two adjacent alignment marks of the first set of alignment marks have substantially the same pitch.

4. The method of claim 1, wherein centers of widths of any two adjacent alignment marks of the second set of alignment marks have substantially the same pitch.

5. The method of claim 1, further comprising: providing a third set of alignment marks at a second surface of the first dielectric layer, wherein the second surface of the first dielectric layer is opposite to the first surface of the first dielectric layer.

6. The method of claim 5, wherein lengths of the third set of alignment marks are in ascending order along the first direction.

7. The method of claim 1, wherein differences between the lengths of any two adjacent alignment marks of the second set of alignment marks are substantially equal.

8. The method of claim 1, wherein the first set of alignment marks has a first pitch and the second set of alignment marks has a second pitch, wherein the first pitch and the second pitch are substantially equal.

9. A method for manufacturing a substrate, comprising:
   (a) providing a first dielectric layer, wherein the first dielectric layer has a first edge and a second edge non-parallel with the first edge;
   (b) forming a first set of alignment marks at the first dielectric layer, wherein distances between the first set of alignment marks and the first edge of the first dielectric layer vary; and
   (c) forming a second set of alignment marks at the first dielectric layer, wherein distances between the second set of alignment marks and the second edge of the first dielectric layer vary,
   wherein lengths of the first set of alignment marks are in ascending order along a first direction, and lengths of the second set of alignment marks are in ascending order along a second direction non-parallel to the first direction.

10. The method of claim 9, wherein centers of widths of any two adjacent alignment marks of the first set of alignment marks have substantially the same pitch.

11. The method of claim 9, wherein centers of widths any two adjacent alignment marks of the second set of alignment marks have substantially the same pitch.

12. The method of claim 9, wherein the first direction is substantially perpendicular to the second direction.

13. A substrate, comprising:
   a first dielectric layer having a first edge;
   a first set of alignment marks disposed at a first surface of the first dielectric layer, wherein distances between the first set of alignment marks and the first edge of the first dielectric layer vary;
   a second dielectric layer over the first set of alignment marks, wherein the second dielectric layer has a second edge; and
   a second set of alignment marks disposed at a first surface of the second dielectric layer, wherein distances between the second set of alignment marks and the second edge of the second dielectric layer vary,
   wherein lengths of the first set of alignment marks are in ascending order along a first direction, and lengths of the second set of alignment marks are in ascending order substantially along the first direction.

14. The substrate of claim 13, wherein differences between the lengths of any two adjacent alignment marks of the first set of alignment marks are substantially equal.

15. The substrate of claim 13, wherein centers of widths of any two adjacent alignment marks of the first set of alignment marks have substantially the same pitch.

16. The substrate of claim 13, wherein centers of widths of any two adjacent alignment marks of the second set of alignment marks have substantially the same pitch.

17. The substrate of claim 13, further comprising: a third set of alignment marks disposed at a second surface of the first dielectric layer, wherein the second surface of the first dielectric layer is opposite to the first surface of the first dielectric layer.

18. The substrate of claim 17, wherein lengths of the third set of alignment marks are in ascending order along the first direction.

19. The substrate of claim 13, wherein differences between the lengths of any two adjacent alignment marks of the second set of alignment marks are substantially equal.

20. The substrate of claim 13, wherein the first set of alignment marks has a first pitch and the second set of alignment marks has a second pitch, wherein the first pitch and the second pitch are substantially equal.

* * * * *